United States Patent
Saleh

[19]

[11] Patent Number: 5,991,135
[45] Date of Patent: Nov. 23, 1999

[54] SYSTEM INCLUDING ESD PROTECTION

[75] Inventor: Farid Saleh, San Jose, Calif.

[73] Assignee: VLSI Technology, Inc., San Jose, Calif.

[21] Appl. No.: 09/076,574

[22] Filed: May 11, 1998

[51] Int. Cl.[6] .................................................. H02H 3/22
[52] U.S. Cl. ............................................. 361/56; 361/111
[58] Field of Search ................................. 361/56, 91, 111

[56] References Cited

U.S. PATENT DOCUMENTS

| | | | |
|---|---|---|---|
| 5,196,981 | 3/1993 | Kuo ........................................... | 361/56 |
| 5,272,097 | 12/1993 | Shiota ....................................... | 437/34 |
| 5,311,083 | 5/1994 | Wanlass ................................... | 307/475 |
| 5,468,984 | 11/1995 | Efland et al. ............................ | 257/356 |
| 5,610,790 | 3/1997 | Staab et al. ............................... | 361/56 |
| 5,617,283 | 4/1997 | Krakauer et al. ........................ | 361/56 |
| 5,654,862 | 8/1997 | Worley et al. ........................... | 361/111 |
| 5,706,156 | 1/1998 | Narita ....................................... | 361/56 |
| 5,721,658 | 2/1998 | Ma et al. .................................. | 361/111 |

*Primary Examiner*—Michael J. Sherry
*Attorney, Agent, or Firm*—Wells, St. John, Roberts, Gregory & Matkin P.S.

[57] ABSTRACT

A method and structure for providing ESD protection for an integrated circuit having multiple pairs of voltage supply rails, each pair including a VDD rail and a VSS rail. In one aspect, ESD devices are connected between pairs of supply rails and I/O pins of the integrated circuit, and antiparallel diodes are connected between respective VSS rails and a VSS-ESD rail.

12 Claims, 4 Drawing Sheets

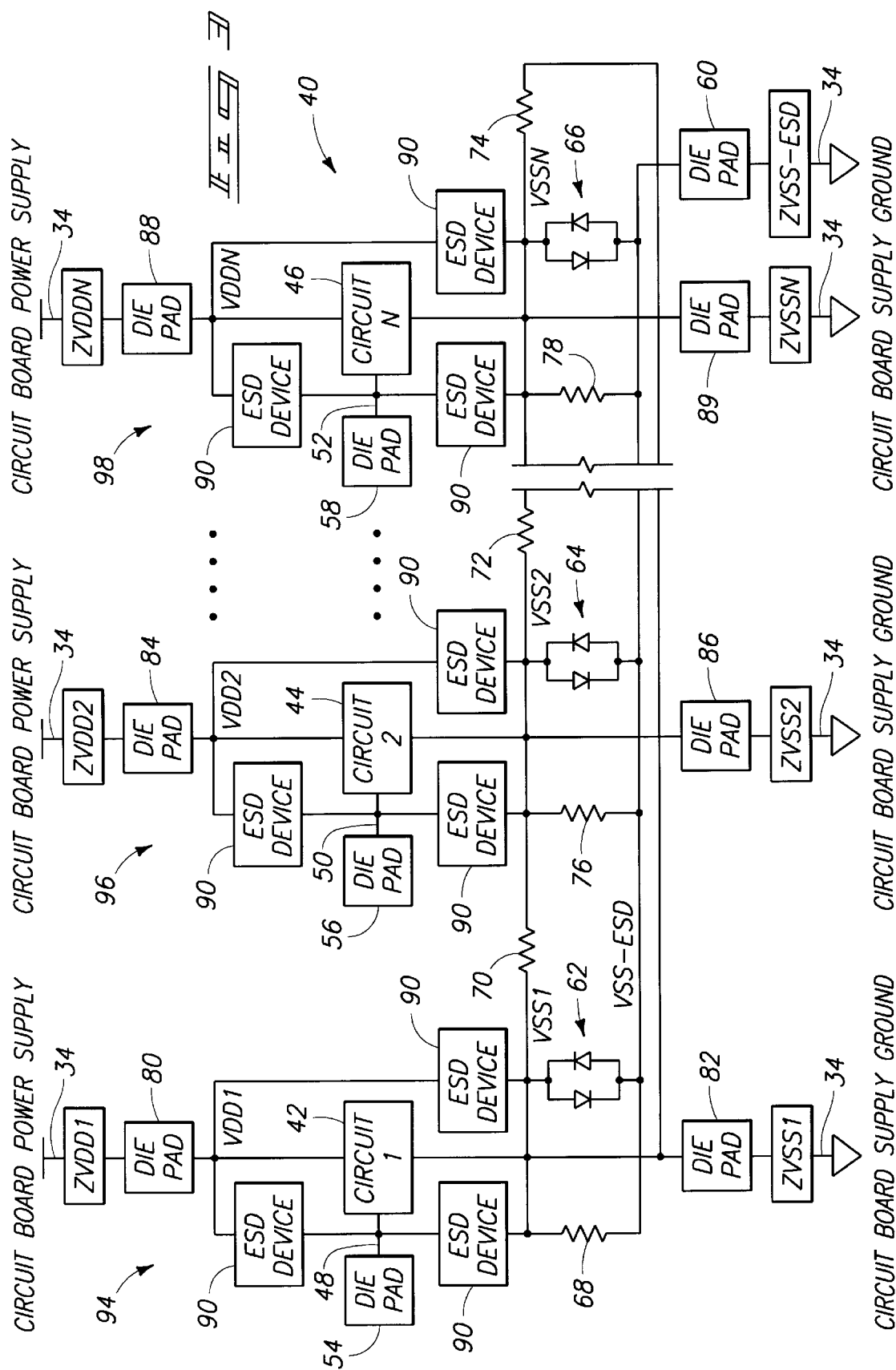

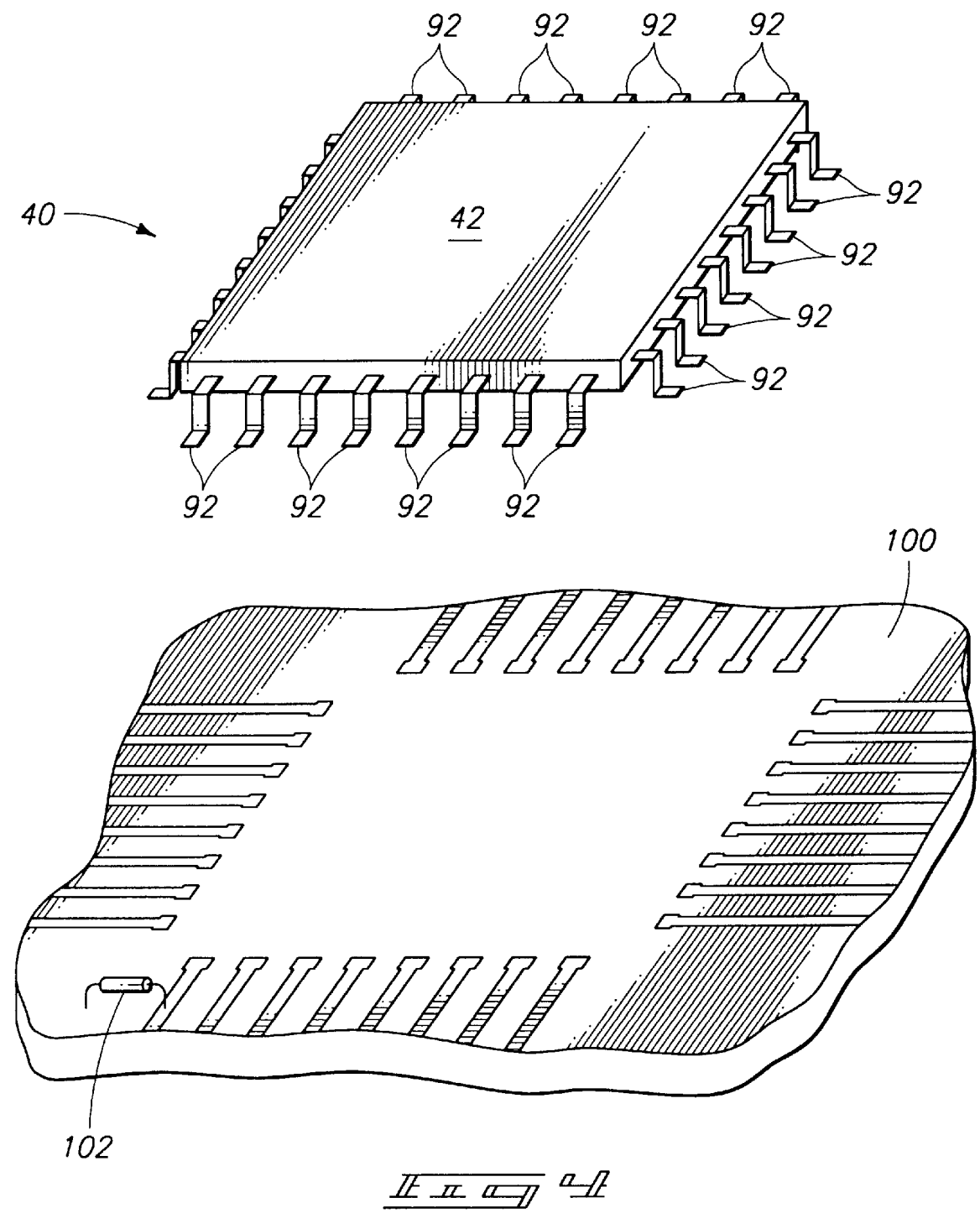

SYSTEM INCLUDING ESD PROTECTION

TECHNICAL FIELD

This invention relates to protection circuits for semiconductor integrated circuits and, more particularly, to ESD protection schemes for mixed signal integrated circuits with multiple power supply domains.

BACKGROUND OF THE INVENTION

It is generally recognized that some semiconductor devices are susceptible to damage from electrical overstress conditions (EOS). These conditions occur when current or voltage ratings for a circuit are exceeded. Exemplary electrical overstress conditions include electrostatic discharge (ESD), transient conditions, incorrect polarity connections, etc. The electrical overstress conditions are characterized by over-voltage and over-current stress events.

Progress in VLSI technology has resulted in smaller and smaller integrated geometry in integrated circuits. As devices become smaller, they also become more sensitive to damage from electrical overstress conditions. Protecting a device from EOS damage is becoming more and more difficult as circuits are now manufactured with numerous layers of thin film materials. More layers result in a more complicated problem to be solved.

Overcoming electrostatic discharge conditions continues to increase in importance as the sensitivity of semiconductor devices increases. Electrostatic charge (ESC) can accumulate in a body and damage semiconductor devices if the body is brought into contact with a semiconductor device. For example, a person may accumulate electrostatic charge by walking across carpeting. The accumulated electrostatic charge can be imparted to semiconductor devices touched by the individual. Some semiconductor devices are sufficiently sensitive that the resultant flow of charge imparted to the device results in permanent damage to the semiconductor device.

Accordingly, it is highly desired to protect semiconductor devices from electrostatic discharge and other electrical overstress conditions. Some solutions have attempted to minimize the accumulation of electrostatic charge to prevent electrostatic discharge. Exemplary solutions have included utilization of protective clothing such as shoes, smocks, etc. for workers in the semiconductor industry. Such approaches may alleviate the problem of electrostatic discharge to some extent but consumers may not be aware of the potential damaging effects of electrostatic discharge upon the electronic components being handled.

Other approaches for abating electrical overstress conditions and electrostatic discharge events with regard to electrical components have included providing electrostatic discharge components within the electrical or semiconductor components themselves.

It is known to provide mixed signal systems on a single integrated circuit. More particularly, it is possible to include both analog and digital circuits on the same integrated circuit. In such circuits, it is desirable to impede digital noise from reaching the analog circuit. In such circuits, the voltage supplies may be the same or may be different.

Traditionally, ESD protection devices have been constructed for the input and output pads of devices to absorb sudden ESD surges. However, such ESD protection devices are designed for devices with a single power supply. For integrated circuits with mixed signals, multiple independent power supply rails are required to isolate different circuit functions. Adequate ESD protection mandates a clamp circuit between different circuit functions to provide a discharge path between pads. Such a clamp circuit requires a large amount of area on the die. With each additional power supply rail, the area required becomes correspondingly larger.

In such an integrated circuit, multiple independent power supply busses are required to accommodate the requirement of isolation between the various circuit functions. It should be noted that there are interacting signals between the different circuit blocks to provide total system functionality. When different circuit blocks on a mixed signal integrated circuit operate on different supply domains, there must be protection structures incorporated between all power and ground supply rails (in addition to protection circuitry within any circuit block) to guard against damage caused during any ESD stressing between the terminals of different circuit blocks with unrelated power rails. Unfortunately, protection structures between different supply domains counteracts with the requirement of isolation between different supply domains.

FIG. 1 shows a typical prior art circuit arrangement in a mixed signal integrated circuit 10 and its ESD protection scheme. The integrated circuit 10 has multiple functional blocks with respective supply domains. These functional blocks 11, 12, and 13 are labeled "Circuit 1," "Circuit 2," through "Circuit N." The supply and ground rails for these blocks respectively are labeled "VDD1, VSS1," "VDD2, VSS2," through "VDDN, VSSN." Each circuit 11, 12, and 13 has no input or multiple input terminals and no output or multiple output terminals. The input/output terminals may be bi-directional. In FIG. 1, the inputs/outputs (I/O) of the circuits 11, 12, and 13 are represented by terminals 14, 15, and 16. What is not shown in the figure, for simplicity, are the interacting signals between circuit blocks that are within the integrated circuit with no external connection. The circuitry is built as a die on a semiconductor substrate and die pads 17, 18, and 19 provide external connections for the circuits 11, 12, and 13.

To protect against an ESD stress event between any two die pads, there should be a high current path between those pads. This is a basic requirement for preventing ESD damage. ESD protection devices 20 labeled "ESD DEVICE" provide this current path during ESD stressing. Each supply domain has an ESD device 20 between its VDD and VSS, between its I/O and VSS, and between its I/O and VDD. Note that these ESD protection devices can be of many different types, such as: grounded gate NMOS, diode connected PMOS or NMOS, p+/well diode, n+/substrate diode, Zener diode, or SCR based clamp. It should also be noted that depending on the type of ESD protection device used between the I/O and VSS, the ESD protection device between the I/O and VDD may be omitted in some designs.

For protection between the supply domains and to provide high current paths, there are cross-coupled ESD devices between each VDD and other VSSs as shown in the FIG. 1. In a usual die the different VSSs are connected together through substrate resistance 21, 22, and 23 indicated as RSUB. The values of the resistances 21, 22, and 23 depend on the type of substrate material used, and geometry of the circuit layout. Note that the values of the resistances 21, 22, and 23 can be the same or different.

Back to Back (or antiparallel) diodes 24, 25, and 26 (BBD) between the different VSSs are also required for ESD protection. The diodes provide a high current path during stress between circuit block pads (e.g., a supply die pad 27, 28, 29, 30, 31, or 32, or I/O pad 17, 18, or 19) of unrelated supply domains. Without the Back to Back diodes 24, 25, and 26, current may be limited by a high substrate resistance, causing a high voltage build up across the substrate, resulting in damage to the IC.

The integrated circuit (IC) die is usually seated in a housing or package. FIG. 2 shows such a typical case 33 for a plastic quad flat pack package. Die pads 17, 18, 19, 27, 28, 29, 30, 31, and 32 are connected to lead frame pins 34 by bond wires 36. Note that there are various kind of packages for ICs that conceptually have similar arrangements. The IC is connected to some sort of circuit board as its final circuit carrier through its package pins. The bond wires 36 and package pins 34 (or in general package terminals if not pins) have a finite amount of electrical impedance. These impedances are usually very inductive. These impedances are shown by ZVDD1, ZVDD2, ZVDDN, ZVSS1, ZVSS2, and ZVSSN in FIG. 1 for supply rail die pads 27, 28, 29, 30, 31, and 32. Note that similar bond wire, and pin connections, and impedances exist for the I/O die pads 17, 18, and 19. These impedances are not shown since they are not relevant to the invention.

Because of these finite impedances ZVDD1, ZVDD2, ZVDDN, ZVSS1, ZVSS2, and ZVSSN, even if the circuit board power supplies and circuit board supply ground are very quiet, during normal operation of IC, there is noise generated on the VDDs and VSSs of different circuit blocks based on the nature of their functionality. As a result, noise from a noisy VDD or VSS can couple through ESD devices or BBDs to other quiet circuit blocks in the configuration of FIG. 1.

The lower frequency noise usually coupled through the conductive path in ESD devices 20 and BBDs 24, 25, and 26 and the higher frequency noise is transferred by capacitance coupling through the parasitic capacitance of the ESD devices and BBDs. This noise coupling phenomena is well known and appreciated by those skilled in the art. Reducing the amount of noise coupling is one of the design challenges in mixed-signal IC design.

The degree of the coupling between the different supply domains depends on the nature of ESD devices 20 and BBDs 24, 25, and 26 (this is almost uncontrollable by designers for a given process technology) and the values of the ZVDDs and ZVSSs. To reduce the amount of noise coupling, the values of ZVDDs and ZVSSs must be reduced. This can be done by having a better package, using lower inductance pins or using multiple die pads and package pins for each of the VDDs and VSSs. However, this is not trivial to accomplish for a given design with a limited number of package pins.

Thus, a drawback of the circuit of FIG. 1 is that noise generated in one supply domain is easily transmitted to an adjacent supply domain. Further, the level of attenuation is much lower than the attenuation provided in the circuit of the invention, described below. Another drawback is the consumption of surface area on the die. To provide ESD protection, cross-coupled ESD devices and BBDs should be provided between every two circuit blocks on the integrated circuit. However, this would take up too much surface area and would be difficult to arrange on the die as the number of supply domains increase.

Therefore, there exists a need to provide protection from electrical overstress conditions while overcoming the drawbacks associated with the prior art.

SUMMARY OF THE INVENTION

The invention provides a system comprising a VDD supply rail, a VSS supply rail, and an additional rail; a circuit coupled between the VDD and VSS supply rails, the circuit including an I/O terminal; an ESD device coupled between the VDD and VSS supply rails; and antiparallel diodes coupling the VSS supply rail to the additional rail.

One aspect of the invention provides ESD protection to integrated circuits with multiple power supplies. Another aspect of the invention provides ESD protection to integrated circuits with multiple power supplies for mixed signal applications.

Another aspect of the invention provides an integrated circuit comprising a plurality of pairs of voltage supply rails, respective pairs including a VDD rail and a VSS rail; a plurality of circuits respectively coupled between pairs of voltage supply rails, the circuits respectively including an I/O terminal; a plurality of ESD devices respectively coupled between pairs of voltage supply rails; a plurality of ESD devices respectively coupled between respective I/O terminals and respective VSS rails; a VSS-ESD rail; and respective pairs of antiparallel diodes coupling the respective second supply rails to the VSS-ESD rail.

Another aspect of the invention provides a method comprising providing a VDD supply rail, a VSS supply rail, and an additional rail in an integrated circuit; coupling a circuit between the VDD and VSS supply rails, the circuit including an I/O terminal; coupling an ESD device between the VDD and VSS supply rails; and coupling antiparallel diodes between the VSS supply rail and the additional rail.

Another aspect of the invention provides a method of protecting circuits in an integrated circuit from electrical overstress conditions, the electrical circuits respectively including at least one I/O node, the method comprising providing respective pairs of voltage supply rails for respective circuits, the respective pairs including a VSS supply rail and a VDD supply rail; coupling ESD protection devices between the respective pairs of voltage supply rails; for respective circuits, coupling ESD protection devices between the I/O node and each supply rail of the pair of supply rails for the circuit; and coupling respective VSS supply rails to an additional supply rail with respective pairs of antiparallel diodes.

BRIEF DESCRIPTION OF THE DRAWINGS

Preferred embodiments of the invention are described below with reference to the following accompanying drawings.

FIG. 3 is a circuit schematic of an integrated circuit in accordance with the invention.

FIG. 4 is a perspective view of an integrated circuit package embodying the invention and a circuit board configured to receive the integrated circuit package.

DETAILED DESCRIPTION OF THE PREFERRED EMBODIMENTS

The present invention provides ESD protection for mixed signal ICs with multiple functional blocks having separate power supply domains, while minimizing the noise coupling from any supply domain to the other ones. Another benefit arising from the invention is a reduction die area due to elimination of some ESD devices and a much simpler, uniform and structured circuit layout.

Figure 1:
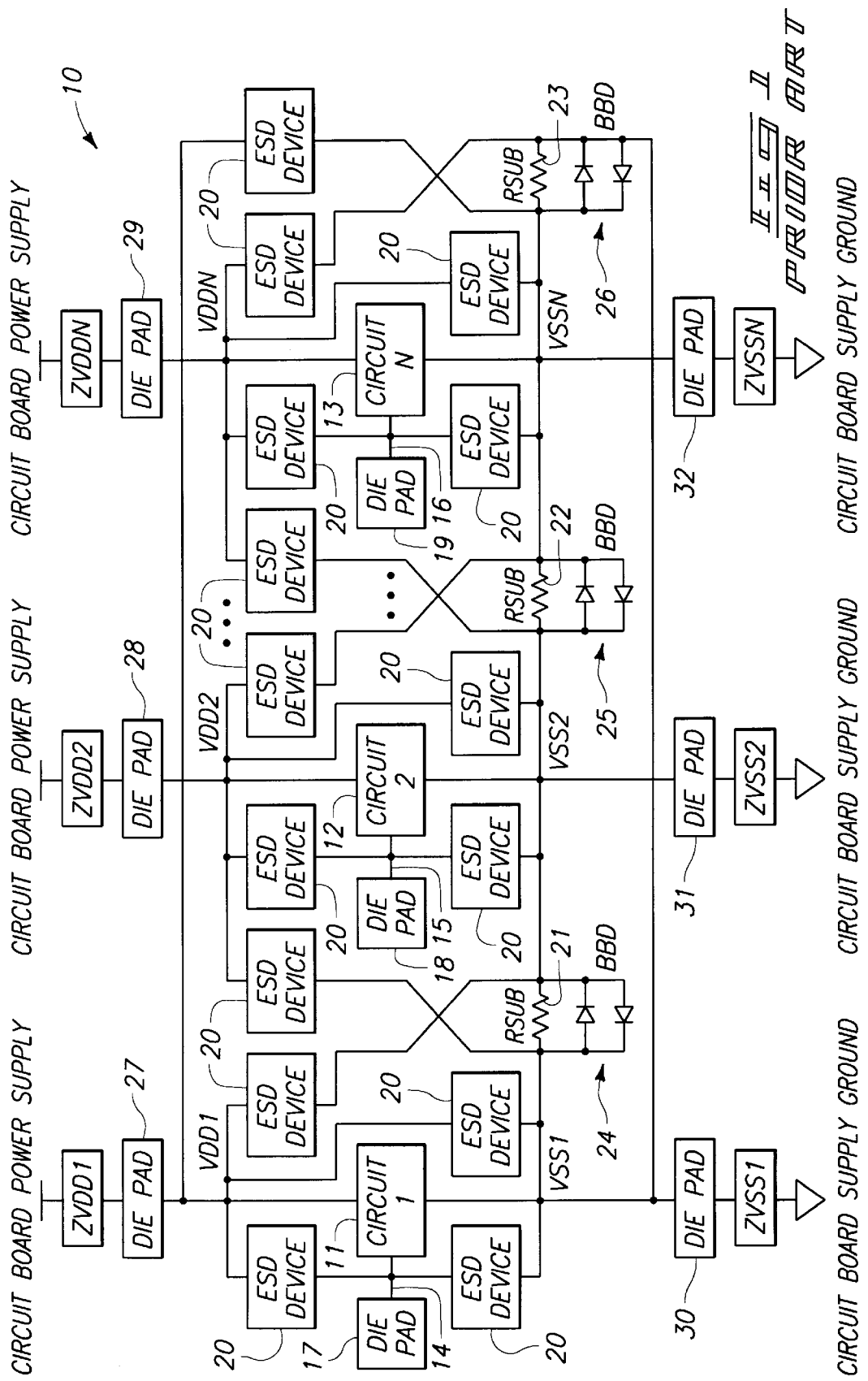
FIG. 1 is circuit schematic of one prior art method of protecting against ESD in a multi-supply integrated circuit.
Figure 2:
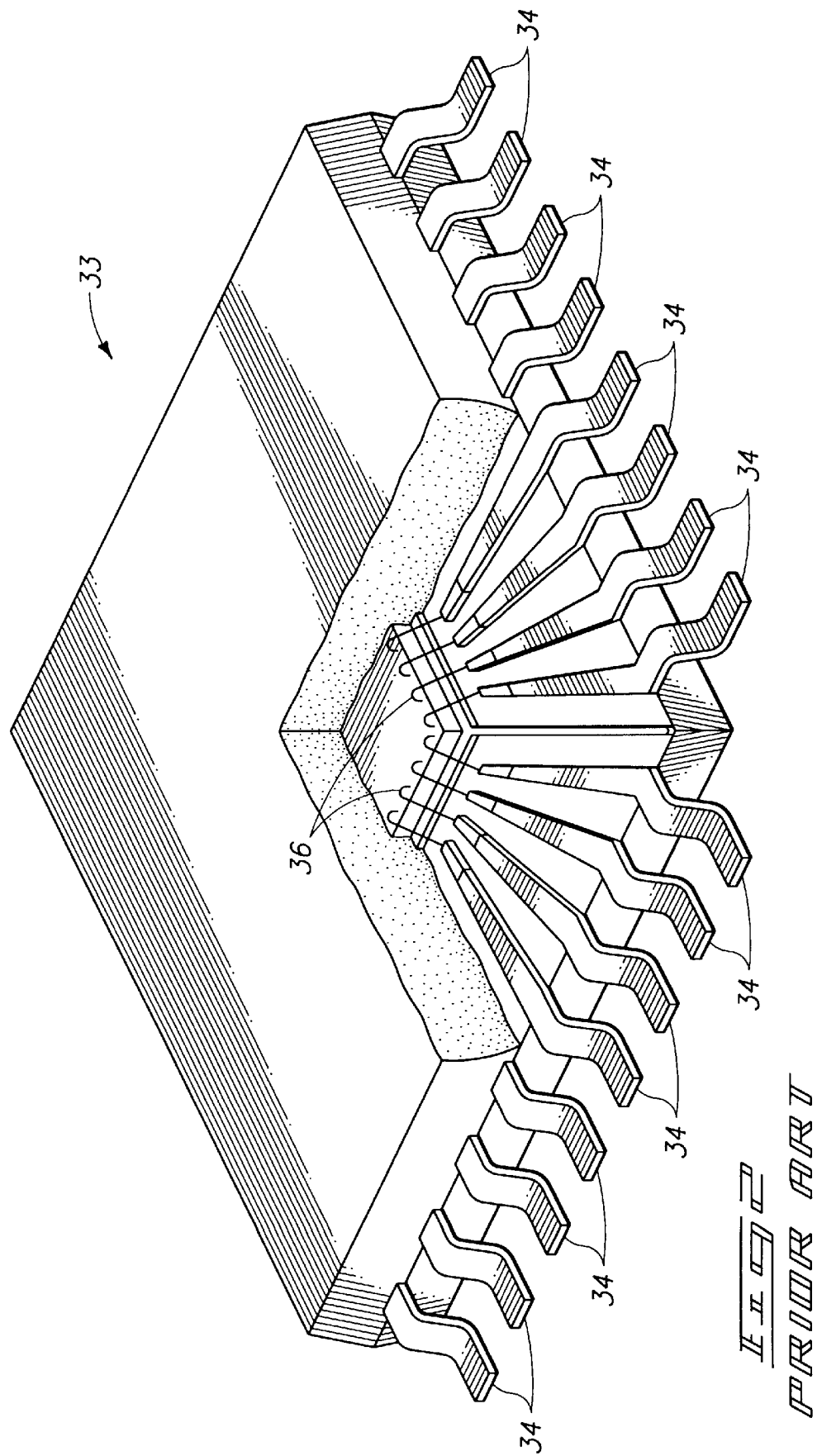
FIG. 2 is a perspective view of a prior art integrated circuit package.

FIG. 3 is circuit diagram of a multiple supply IC 40 with ESD protection and improved noise isolation in accordance with the present invention. The circuit has some basic elements in common with those described in FIG. 1. More particularly, the integrated circuit 40 includes a housing or package 42 (FIG. 4) supporting a die including circuitry shown in FIG. 3. The integrated circuit 40 comprises a plurality of pairs of voltage supply rails VDD1, VSS1; VDD2, VSS2 . . . VDDN, VSSN. The integrated circuit 40 further includes a plurality of circuits CIRCUIT 1, CIRCUIT 2, . . . CIRCUIT N. CIRCUIT 1 is designated by reference numeral 42, CIRCUIT 2 is referenced by reference numeral 44, and CIRCUIT N is designated by reference numeral 46. The circuits CIRCUIT 1, CIRCUIT 2, . . . CIRCUIT N are coupled between respective pairs of voltage supply rails via die pads 80, 82, 84, 86, 88, and 89. Each circuit 42, 44, and 46 has no input or multiple input terminals and an output or multiple output terminals. The input/output terminals may be bi-directional. In FIG. 3, the inputs/outputs (I/O) of circuits 42, 44, and 46 are represented by terminals 48, 50, and 52 respectively. The integrated circuit 40 further includes die pads 54, 56, and 58 coupled to the input/output terminals 48, 50, and 52, respectively. The die pads 54, 56, 58, 60, 80, 82, 84, 86, 88, and 89 are each coupled to one or more pins 92 (FIG. 4).

In the illustrated embodiment, at least one of the circuits 42, 44, and 46 is a digital circuit, and another of the circuits 42, 44, and 46 is an analog circuit. Thus, although other alternatives are possible, in one embodiment, the circuits are operating in a mixed signal environment on the integrated circuit 40. For example, in one embodiment, one of the circuits 42, 44, and 46 is configured to operate at a first voltage and another of the circuits is configured to operate at a second voltage different from the first voltage. For example, the circuit 42 could be a 5 volt circuit, and the circuits 44 and 46 could be 3.3 volt circuits. Of course, circuits designed to operate at a certain supply voltage have some tolerance for variations in the supply voltage. Thus, in one embodiment, one of the circuits 42, 44, and 46 is configured to operate in a first voltage range, and another of the circuits 42, 44, and 46 is configured to operate in a second voltage range different from the first voltage range. In one embodiment, the circuits 42, 44, and 46 on the integrated circuit 40 are configured to operate at the same voltage, but the supply rails VDD1, VDD2 . . . VDDN are still coupled to different pins 92 of the integrated circuit package or housing. The supply rails VDD1, VDD2 . . . VDDN could be connected together inside the integrated circuit 10; however, if they are connected together on the inside of the integrated circuit 40, noise will more easily be coupled between different supply domains 94, 96, and 98. By coupling separate pins to the respective supply rails VDD1, VDD2 . . . VDDN, better isolation between supply domains 94, 96, and 98 can be provided. More particularly, there is more flexibility on the circuit board 100 which receives the integrated circuit 40 to isolate separate supply domains; e.g., by using bypass capacitors 102 (FIG. 4). It is much more difficult to include capacitors on the integrated circuit 40.

The respective circuits 42, 44, 46 perform any of various functions. For example, the integrated circuit 40 can include any number of each of the following types of circuits: a parallel to serial converter (traditional CMOS logic), a phase/frequency detector for a phase lock loop (CML logic); a charge pump and voltage controlled oscillator for a phase lock loop (analog circuits); a serial to parallel converter (traditional CMOS logic); serial data differential input buffers (analog circuits); serial data differential output drivers (analog circuits); parallel data input buffers (traditional CMOS logic); parallel data output drivers (traditional CMOS logic); or other types of CMOS, CML, or analog circuits.

The integrated circuit 40 further includes a plurality of electrostatic discharge (ESD) or EOS (electrical overstress) protection devices 90 to protect against an ESD stress event between any two die pads. ESD protection devices 90 labeled "ESD DEVICE" provide a current path during ESD stressing. Each supply domain has an ESD device 90 between its VDD and VSS, between its I/O and VSS, and between its I/O and VDD. Note that these ESD protection devices can be of many different types, such as: grounded gate NMOS, diode connected PMOS or NMOS, p+/well diode, n+/substrate diode, Zener diode, or SCR based clamp. Alternatively, the ESD or EOS devices can comprise ESD or EOS circuitry shown in any of the following patents: U.S. Pat. Nos. 5,610,790 to Staab et al; 5,654,862 to Worley et al; 5,311,083; 5,468,984 to Efland et al.; 5,617,283 to Krakauer et al.; or 5,272,097 to Shiota, all of which are incorporated herein by reference. The ESD devices 90 may all be of the same design, or may be of different designs. It should also be noted that depending on the type of ESD protection device used between the I/O and VSS, the ESD protection device between the I/O and VDD may be omitted in some designs.

The cross coupled ESD devices between VDDs and VSSs of different supply domains are eliminated. Further the BBDs between various VSSs are also removed. A new ground line called VSS-ESD is added to the circuit 40 with its own single or multiple (one is shown) die pad 60 that is coupled to a single or multiple package pins 34 which are coupled to the circuit board supply ground. The circuit 40 includes antiparallel or Back to Back diode pairs (BBD) 62, 64, and 66 connected between each VSS and VSS-ESD.

Based on the Back to Back diodes implementation on the die, the VSS-ESD may have a resistive connection to the substrate and as a result have resistive connections to the various VSSs, as shown by substrate resistances 68, 70, 72, 74, 76, and 78 in FIG. 3.

The invented architecture does provide ESD protection during ESD stressing by providing high current path between any two die pads. It can be easily seen that there is always a path form any die pad to other one in different supply domains going through two forward biased diodes of two BBDs between VSSs and VSS-ESD.

Also, the invention does reduce the noise coupling by great amount between the supply domains. First, it eliminates the coupling through ESD devices between VDDs and VSSs in different blocks—as existed in prior art—simply by eliminating such a device. Second, during normal IC operation, any noise in any VSS will be first coupled through a BBD's parasitics across the ZVSS-ESD and then through another BBD's parasitics across another block's VSS and ZVSS. This will highly attenuate the degree of noise coupling from a noisy VSS to a quiet VSS.

The amount of noise coupling depends on the impedance values. However, by reducing the value of ZVSS-ESD the noise can be substantially reduced or even almost eliminated. Since VSS-ESD is only one connection (as opposed to many VDDs and VSSs) a low inductance package pin 92 or multiple die pads along with multiple package pins can be used to reduce the value of ZVSS-ESD.

It is also evident that the layout structure of the invented scheme is much simpler and uniform compared to one for the prior art that needs an ESD device between every VDD and VSS of different blocks and a BBD between every two VSSs.

Thus, the invention provides ESD protection within a multi-supply integrated circuit, and also provides high noise isolation between supply domains. Noise generated in one supply domain (e.g., including a digital circuit) is not coupled or is highly attenuated before it is coupled to other circuit's supply. This is particularly true when the VSS-ESD rail has a low impedance connection to the board 100 and main supply ground.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. An integrated circuit comprising:

an integrated circuit package including a housing and pins extending from the housing;

a plurality of pairs of voltage supply rails, respective pairs including a VDD rail and a VSS rail;

a plurality of circuits respectively coupled between pairs of voltage supply rails, the circuits respectively including I/O terminals;

a VSS-ESD rail which does not form a part of any of the VSS rails;

a plurality of ESD devices respectively coupled between pairs of VDD and VSS rails;

a plurality of ESD devices respectively coupled between respective I/O terminals and respective VSS rails; and a plurality of antiparallel diodes coupling the respective VSS rails to the VSS-ESD rail, wherein the housing houses the plurality of pairs of voltage supply rails, the plurality of circuits, the VSS-ESD rail, the plurality of ESD devices coupled between pairs of VDD and VSS rails, and the plurality of ESD devices respectively coupled between respective I/O terminals and respective VSS rails, and wherein the I/O terminals, VDD rails, VSS rails, and VSS-ESD rail are coupled to pins of the integrated circuit package.

2. An integrated circuit in accordance with claim 1 wherein the VSS-ESD rail is a ground rail.

3. An integrated circuit in accordance with claim 1 wherein one of the circuits is a digital circuit and another of the circuits is an analog circuit.

4. An integrated circuit in accordance with claim 1 wherein one of the circuits is configured to operate at a first voltage and another of the circuits is configured to operate at a second voltage different from the first voltage.

5. An integrated circuit in accordance with claim 1 wherein one of the circuits is configured to operate in a first voltage range and another one of the circuits is configured to operate in a second voltage range different from the first voltage range.

6. An integrated circuit in accordance with claim 1 wherein one of the circuits interacts with another one of the circuits.

7. A method of protecting electrical circuits, in an integrated circuit, from electrical overstress conditions, the electrical circuits including I/O nodes, at least one of the circuits interacting with at least one other of the circuits, the method comprising:

providing respective pairs of voltage supply rails for respective circuits, the respective pairs including a VSS supply rail and a VDD supply rail;

coupling ESD protection devices between the respective pairs of voltage supply rails;

for respective circuits, coupling ESD protection devices between the I/O nodes and each supply rail of the pair of supply rails for the circuit; and coupling respective VSS supply rails to a VSS-ESD rail which does not form a part of any of the VSS supply rails.

8. A method of protecting circuits in an integrated circuit from electrical overstress conditions in accordance with claim 7 and further comprising coupling the VSS-ESD rail to an electrical ground.

9. A method of protecting circuits in an integrated circuit from electrical overstress conditions in accordance with claim 7 wherein the circuits comprise both digital and analog circuits.

10. A method of protecting circuits in an integrated circuit from electrical overstress conditions in accordance with claim 7 and further comprising operating different circuits in the integrated circuit at different voltages.

11. A method of protecting circuits in an integrated circuit from electrical overstress conditions in accordance with claim 7 and further comprising configuring one of the circuits in the integrated circuit to operate in a first voltage range and configuring another of the circuits in the integrated circuit to operate in a second voltage range different from the first voltage range.

12. A method of protecting circuits in an integrated circuit from electrical overstress conditions in accordance with claim 7 and further comprising coupling the respective VDD rails to respective pins of the integrated circuit.

* * * * *